US007382622B2

(12) United States Patent
Li et al.

(10) Patent No.: US 7,382,622 B2
(45) Date of Patent: Jun. 3, 2008

(54) HEAT SINK ASSEMBLY

(75) Inventors: Dong-Yun Li, Shenzhen (CN); Min Li, Shenzhen (CN); Hong-Cheng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 11/309,904

(22) Filed: Oct. 26, 2006

(65) Prior Publication Data
US 2008/0101030 A1 May 1, 2008

(51) Int. Cl.
*H05K 7/20* (2006.01)
(52) U.S. Cl. .................. 361/719; 24/457; 24/458; 165/80.3; 165/185; 248/505; 248/510; 257/718; 257/719; 361/704; 361/710
(58) Field of Classification Search ................. 361/719
See application file for complete search history.

(56) References Cited
U.S. PATENT DOCUMENTS
5,734,556 A * 3/1998 Saneinejad et al. ......... 361/719

| | | | |
|---|---|---|---|
| 6,353,537 B2 * | 3/2002 | Egawa ........................ 361/704 |
| 6,492,202 B1 * | 12/2002 | Lober et al. ................. 438/122 |
| 6,683,449 B1 * | 1/2004 | Bell et al. ................. 324/158.1 |
| 6,734,371 B2 * | 5/2004 | Arrigotti et al. ............ 174/260 |
| 7,183,496 B2 * | 2/2007 | Arrigotti et al. ............ 174/260 |
| 7,324,344 B2 * | 1/2008 | Sya et al. ..................... 361/719 |
| 2003/0015343 A1 * | 1/2003 | Chen .......................... 174/252 |
| 2005/0094377 A1 * | 5/2005 | Lee et al. ................... 361/704 |
| 2006/0012960 A1 * | 1/2006 | Hsieh et al. ................. 361/703 |

* cited by examiner

*Primary Examiner*—Gregory D Thompson
(74) *Attorney, Agent, or Firm*—Jeffrey T. Knapp

(57) ABSTRACT

A heat sink has a base (10), a plurality of fins (12, 14) and a central receiving groove (16) in the fins. A first positioning portion (1250) extends from a first fin at a side of the receiving groove and a positioning slot (1256) is defined therein. The clip includes a main body (23) and a pair of legs (25). The main body includes a retaining portion (230) and a first pressing portion (232). The main body is received in the receiving groove and the first pressing portion is accommodated in the positioning slot. The retaining portion is offset from the first pressing portion. The legs can be pressed to securely connect with a printed circuit board (3), whereby the heat sink can have an intimate contact with a CPU (4).

14 Claims, 6 Drawing Sheets

HEAT SINK ASSEMBLY

FIELD OF THE INVENTION

The present invention relates to heat sink assemblies having clips which readily attach a heat sink to a heat-generating electronic device in a computer.

DESCRIPTION OF RELATED ART

In a computer, a heat sink is often used to remove heat generated by certain electronic devices such as central processing units (CPUs). A clip is frequently used to attach the heat sink to the electronic device. Conventional clips frequently cause difficulties during assembly. This is particularly so when a clip is made of stiff metal with a view to tightly securing a heat sink. A tool is thus often required to effect attachment of the clip. The tool is prone to slip and damage the electronic device and components on and around the electronic device. Furthermore, a conventional clip is passive. Therefore if the heat sink is slightly displaced, the clip cannot self-correct to urge the heat sink to return to its original pre-displaced position. Moreover, when a heat sink is subjected to vibration during normal operation or transportation, certain conventional clips are prone to slip relative to the heat sink. This can seriously reduce the stability of a heat sink assembly and the efficiency of heat removal.

Therefore, an improved heat sink assembly is desired to overcome the above-mentioned problems.

SUMMARY OF THE INVENTION

A heat sink assembly includes a heat sink and a clip. The heat sink has a base and a plurality of fins extending from the base. A central receiving groove is defined between the fins. A first positioning portion extends from a first fin at a side of the receiving groove and a positioning slot is defined therein. The clip includes a main body and a pair of legs extending from opposite ends of the main body. Each leg is provided with a hooked foot at a free end thereof. The main body includes a retaining portion and a first pressing portion extending from the retaining portion. The main body is received in the receiving groove and the first pressing portion accommodated in the positioning slot is positioned between the first positioning portion and the base of the heat sink. The leg can be pressed to a position so that the hooked foot hooks with a handle on a printed circuit board on which an electronic component is mounted. Thus, the heat sink can have an intimate contact with the electronic component.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
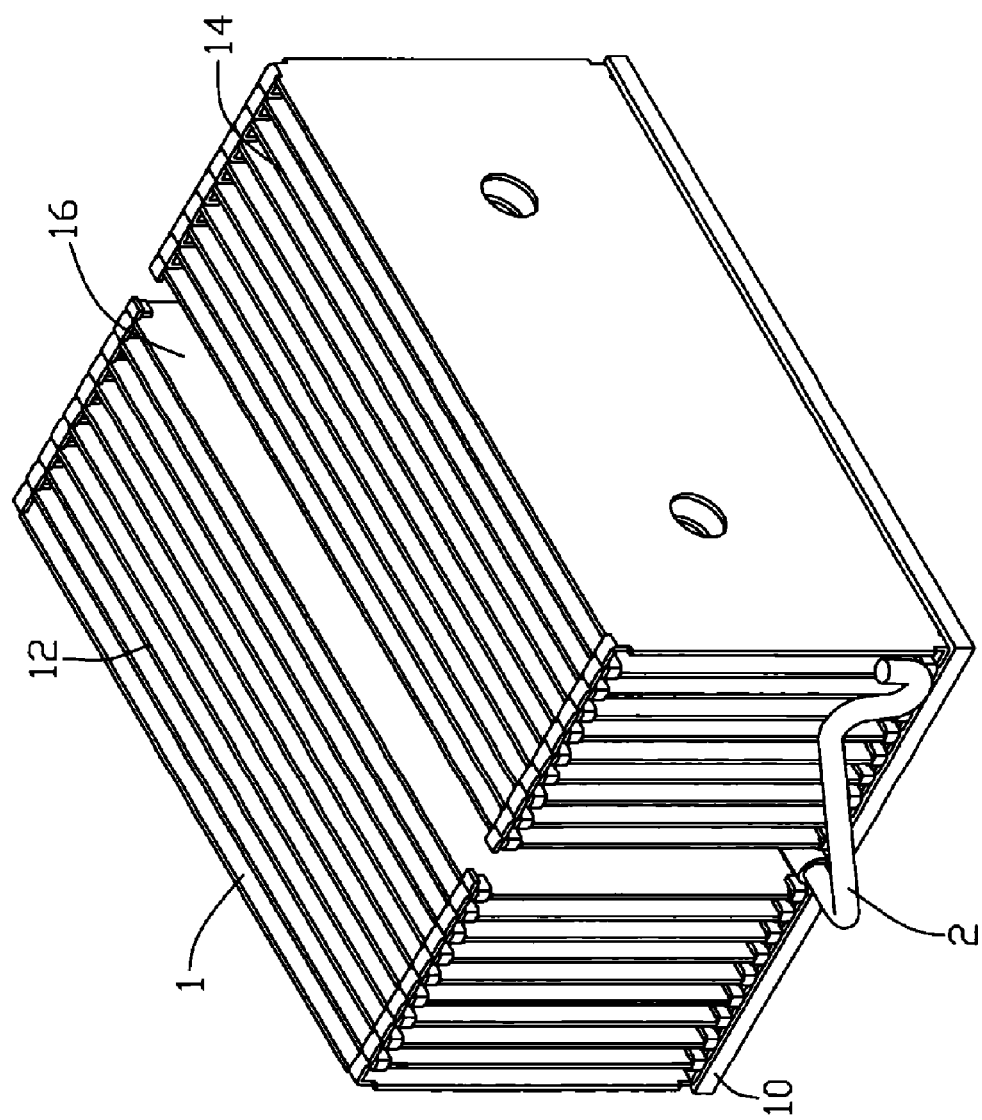
FIG. 1 is an assembled, isometric view of a heat sink assembly in accordance with a preferred embodiment of the present invention.

FIG. 1 shows a heat sink assembly in accordance with a preferred embodiment of the present invention. The heat sink assembly includes a heat sink 1 and a wire clip 2 positioned in the heat sink 1. The heat sink 1 has a base 10, and first and second arrays of parallel fins 12, 14 extending upwardly from the base 10. A central longitudinal receiving groove 16 is defined between the first and second arrays of fins 12, 14 and extended from one side of the base 10 to an opposite side of the base 10, for receiving the clip 2.

Figure 2:
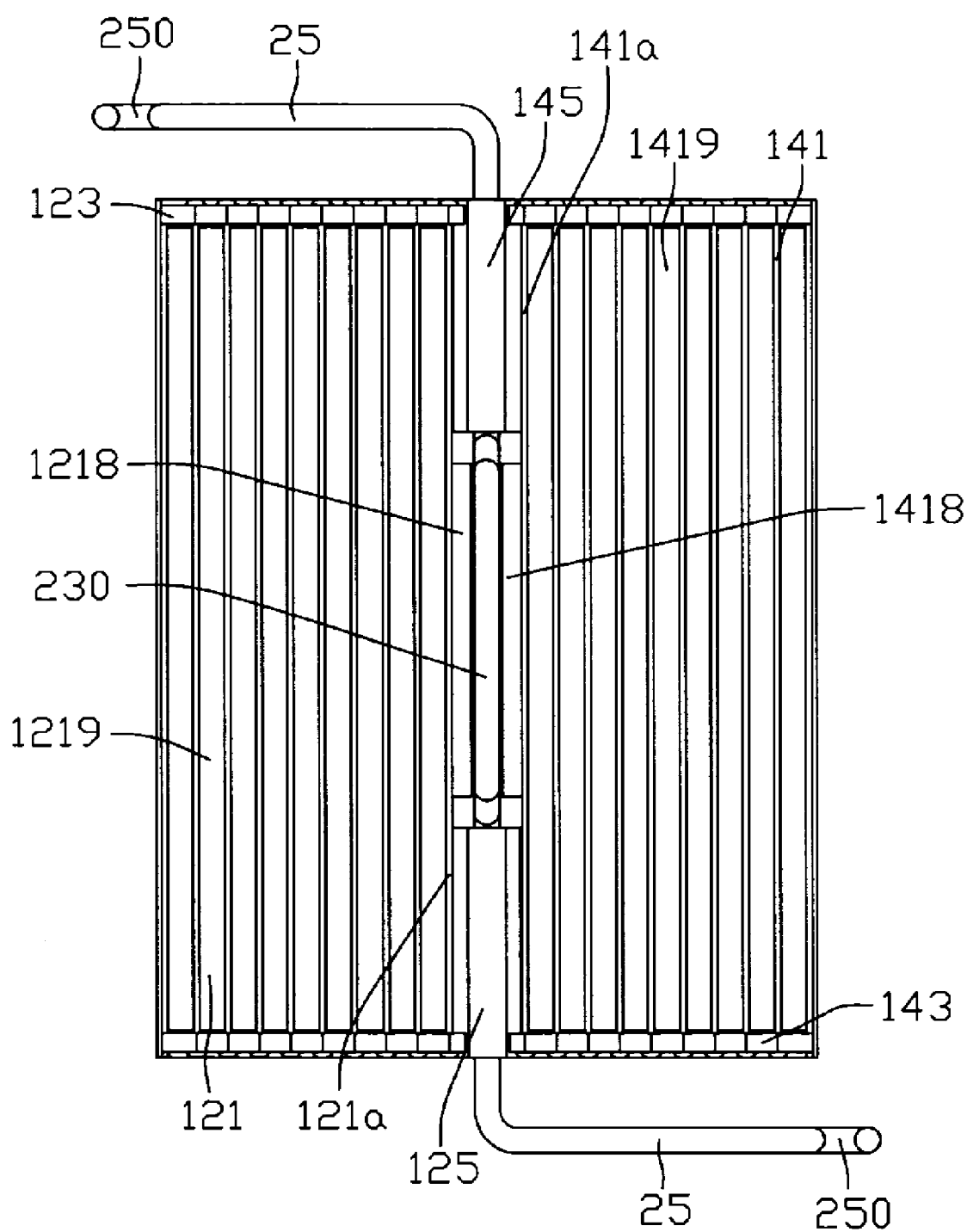
FIG. 2 is a top view of FIG. 1.
Figure 3:
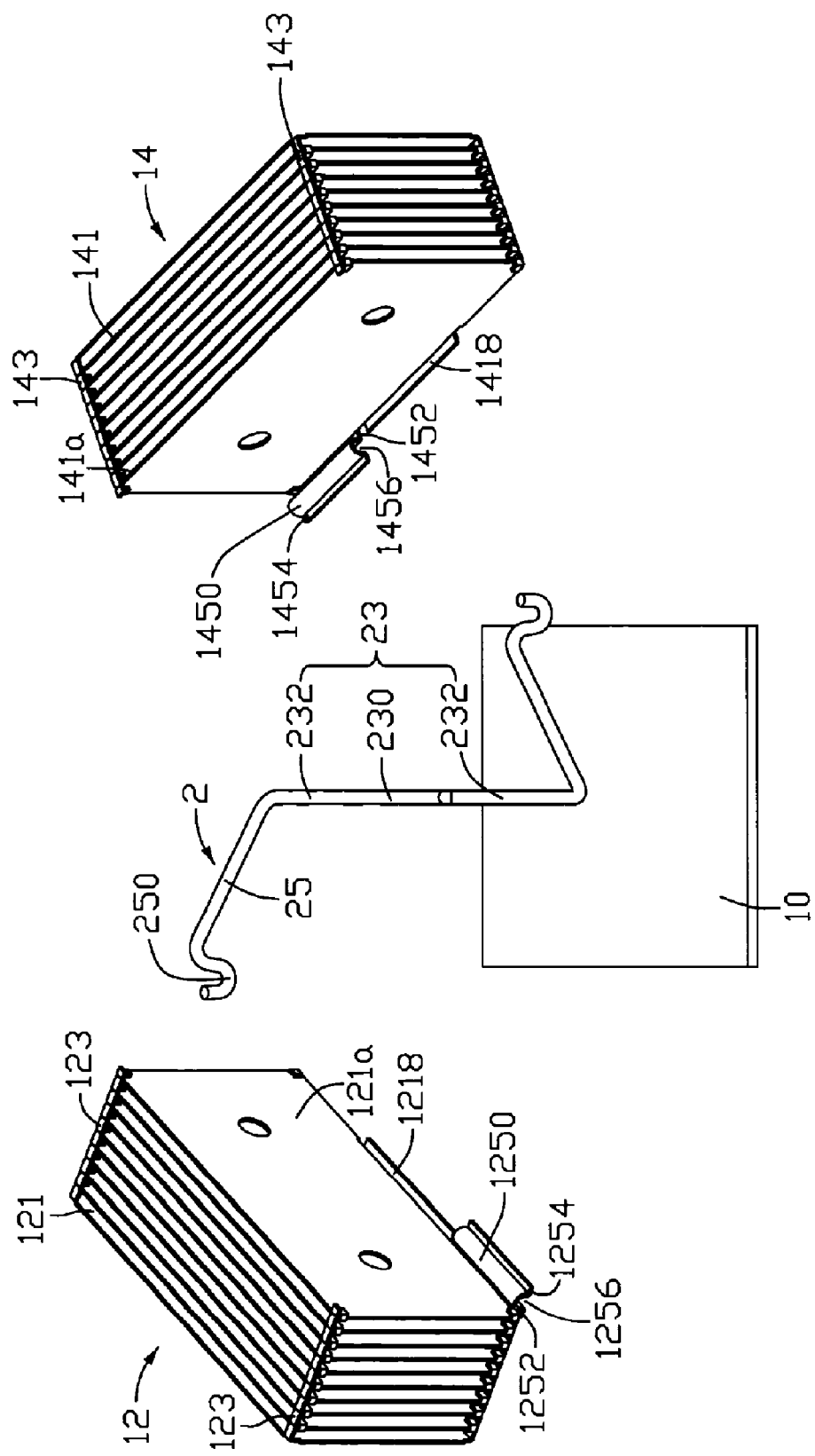
FIG. 3 is an exploded view of FIG. 1.

Referring to FIGS. 2-3, the first array of fins 12 comprises a plurality of parallel spaced first fins 121 and a plurality of channels (not labeled) each extending between two adjacent first fins 121. Each first fin 121 comprises four hooked portions 123 at four corners thereof, for engaging with each other. An outmost first fin 121a facing the receiving groove 16 has a first positioning piece 125 and a first flange 1218 both extending from a bottom edge thereof toward the receiving groove 16. The first positioning piece 125 comprises a first positioning portion 1250 and a pair of first joining portions 1252, 1254 extending from opposite sides of the first positioning portion 1250. The first joining portions 1252, 1254 are attached on a top surface of the base 10. The first positioning portion 1250 is upwardly vaulted and thus defines a first positioning slot 1256 with a downward opening, for cooperating with the top surface of the base 10 to position the clip 2 on the base 10 of the heat sink 1. The first flange 1218 is attached on the top surface of the base 10. The second array of fins 14 comprises a plurality of parallel spaced second fins 141 and a plurality of channels (not labeled) each extending between two adjacent second fins 141. Each second fin 141 comprises four hooked portions 143 at four corners thereof, for engaging with each other. An outmost second fin 141a facing the receiving groove 16 has a second positioning piece 145 and a second flange 1418 both extending from a bottom edge thereof and facing the outmost first fin 121a of the first array of fins 12. The second positioning piece 145 comprises a second positioning portion 1450 and a pair of second joining portions 1452, 1454 extending from opposite sides of the second positioning portion 1450. The second positioning portion 1450 is vaulted and thereby defines a second positioning slot 1456 with a downward opening, for cooperating with the top surface of the base 10 to position the clip 2 on the base 10 of the heat sink 1. The second flange 1418 and the second joining portions 1452, 1454 are attached on the top surface of the base 10. The first positioning piece 125 is arranged in a front end of the first fin group 12, while the second positioning piece 145 is arranged in a rear end of the second fin group 14. The first and second flanges 1218, 1418 are located between and separate from the first and second positioning pieces 125, 145.

The clip 2 is made from a single piece of metallic wire. The clip 2 comprises a central main body 23, and a pair of legs 25 extending from opposite ends of the main body 23. The main body 23 comprises three integrally connected portions which are named according to their functions as a retaining portion 230 in a middle thereof and a pair of pressing portions 232 extending from opposite ends of the retaining portion 230. The retaining portion 230 is U-shaped and offset away from each pressing portion 232. The retaining portion 230 is upwardly projected from and angled to each pressing portion 232, for providing stabilization of the whole clip 2 and preventing the clip 2 from moving in a direction parallel to the receiving groove 16. Each leg 25 extends upwardly and outwardly from a distal end of a corresponding pressing portion 232. The legs 25 extend in different directions, and are oriented relative to each other such that the clip 30 is broadly Z-shaped when viewed from above (see also FIG. 2). A hooked foot 250 extends downwardly and outwardly from a distal end of each leg 25.

Figure 4:
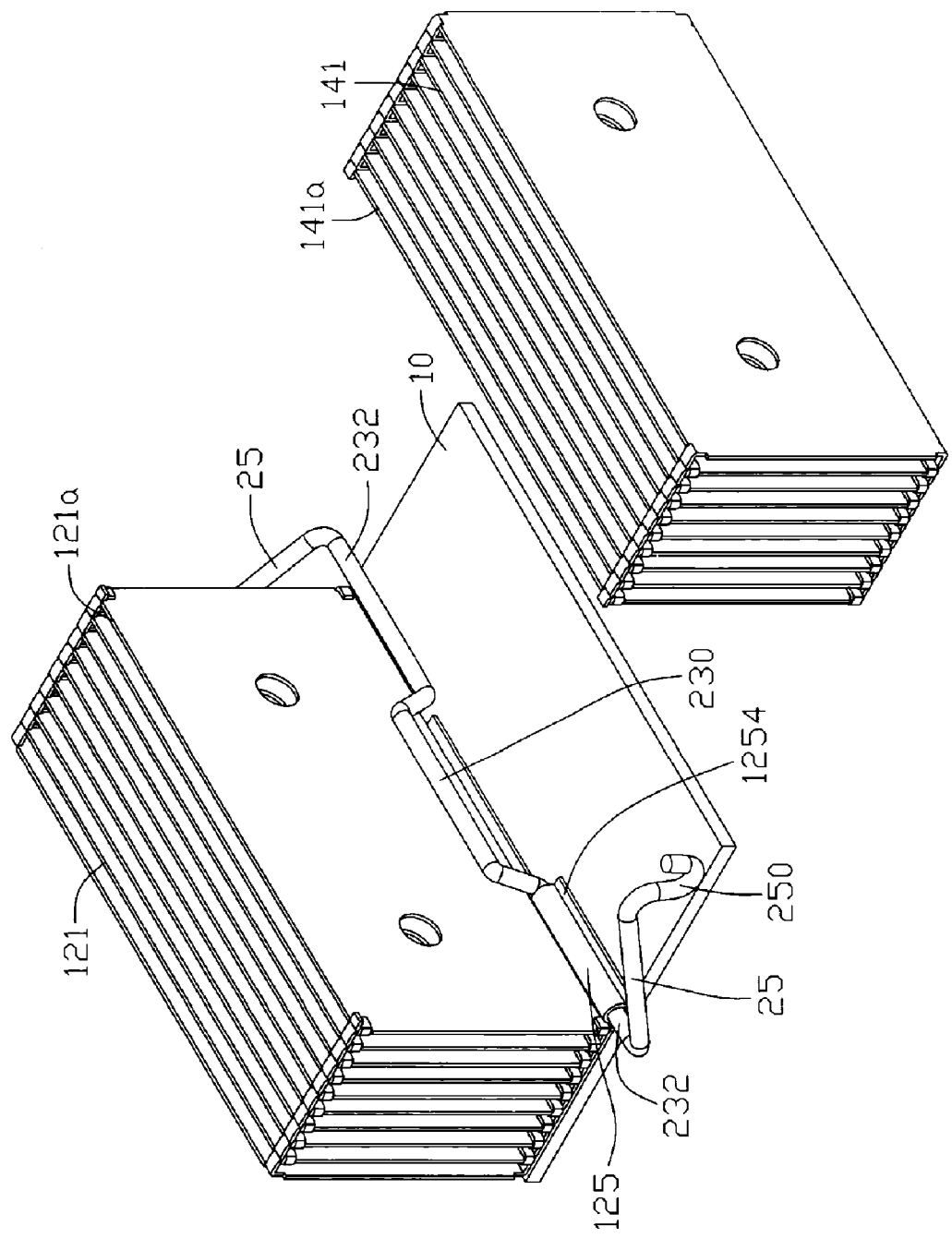
FIG. 4 is a partly assembled view of FIG. 3.

Referring to FIG. 4, the main body 23 of the clip 2 is put on the top surface of the base 10 of the heat sink 1. A bottom of the first array of fins 12 is attached on one side of the base 10 and the first positioning portion 1250 of the first positioning piece 125 is pressed on a corresponding pressing portion 232 of the main body 23 of the clip 2 so that the pressing portion 232 of the clip 2 is received in the first positioning slot 1256. The first joining portions 1252, 1254 of the first positioning piece 125 are mounted on the top surface of the base 10 so that the pressing portion 232 is positioned between the first positioning portion 1250 and the top surface of the base 10 by the first positioning piece 125 cooperating with the top surface of the base 10. The second array of fins 14 is placed to attach on an opposite side of the base 10 and the second positioning piece 145 is pressed on the other pressing portion 232 of the clip 2 so that the other pressing portion 232 is accommodated in the second positioning slot 1456. The second joining portions 1452, 1454 of the second positioning piece 145 are mounted on the top surface of the base 10 and the other pressing portion 232 accommodated in the second positioning slot 1456 of the second positioning piece 145 is positioned between the second positioning portion 1450 and the top surface of the base 10 by the second positioning piece 145 cooperating with the top surface of the base 10. Thus, the clip 2 is prevented from moving in vertical and lateral directions. The retaining portion 230 is projected from the base 10 of the heat sink 1 to a level above the first and second positioning portions 1250, 1450 to prevent the clip 2 from moving in a direction parallel to the receiving groove 16 of the heat sink 1. The first and second positioning portions 1250, 1450 of the first and second positioning pieces 125, 145 cooperate with the top surface of the base 10 to position the pressing portions 232 of the clip 2 on the base 10 of the heat sink 1. After the first array of fins 12, the second array of fins 14 and the clip 2 are placed on the top surface of the base 10 of the heat sink 1 in a manner as shown in FIG. 1, the first array of fins 12, the second array of fins 14 and the base 10 of the heat sink 1 are soldered together whereby they are mechanically and thermally connected, while the clip 2 can be rotated in the first and second positioning slots 1256, 1456.

Figure 5:
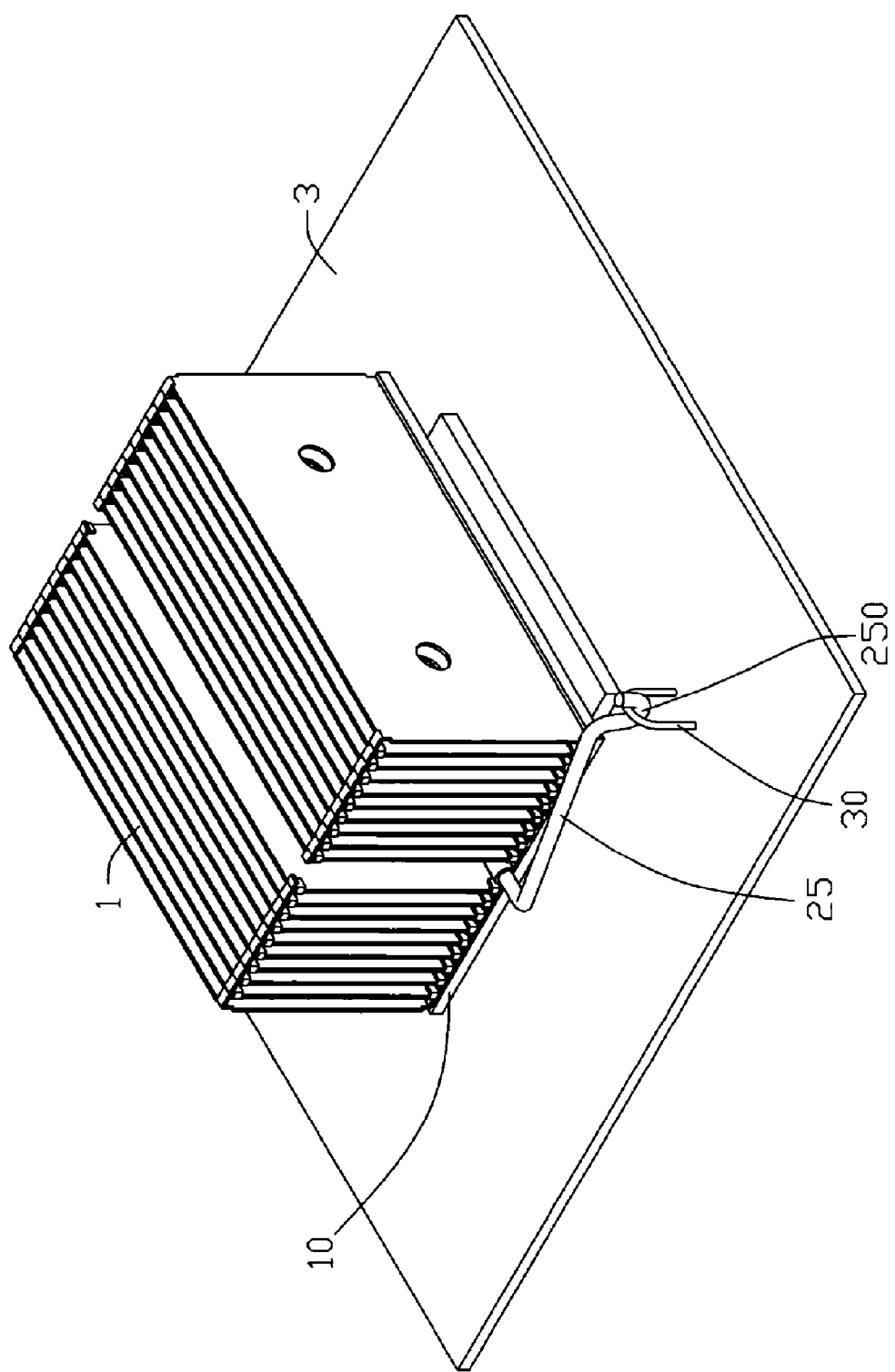
FIG. 5 is a perspective view of the heat sink assembly of FIG. 1 mounted on an electronic assembly.
Figure 6:
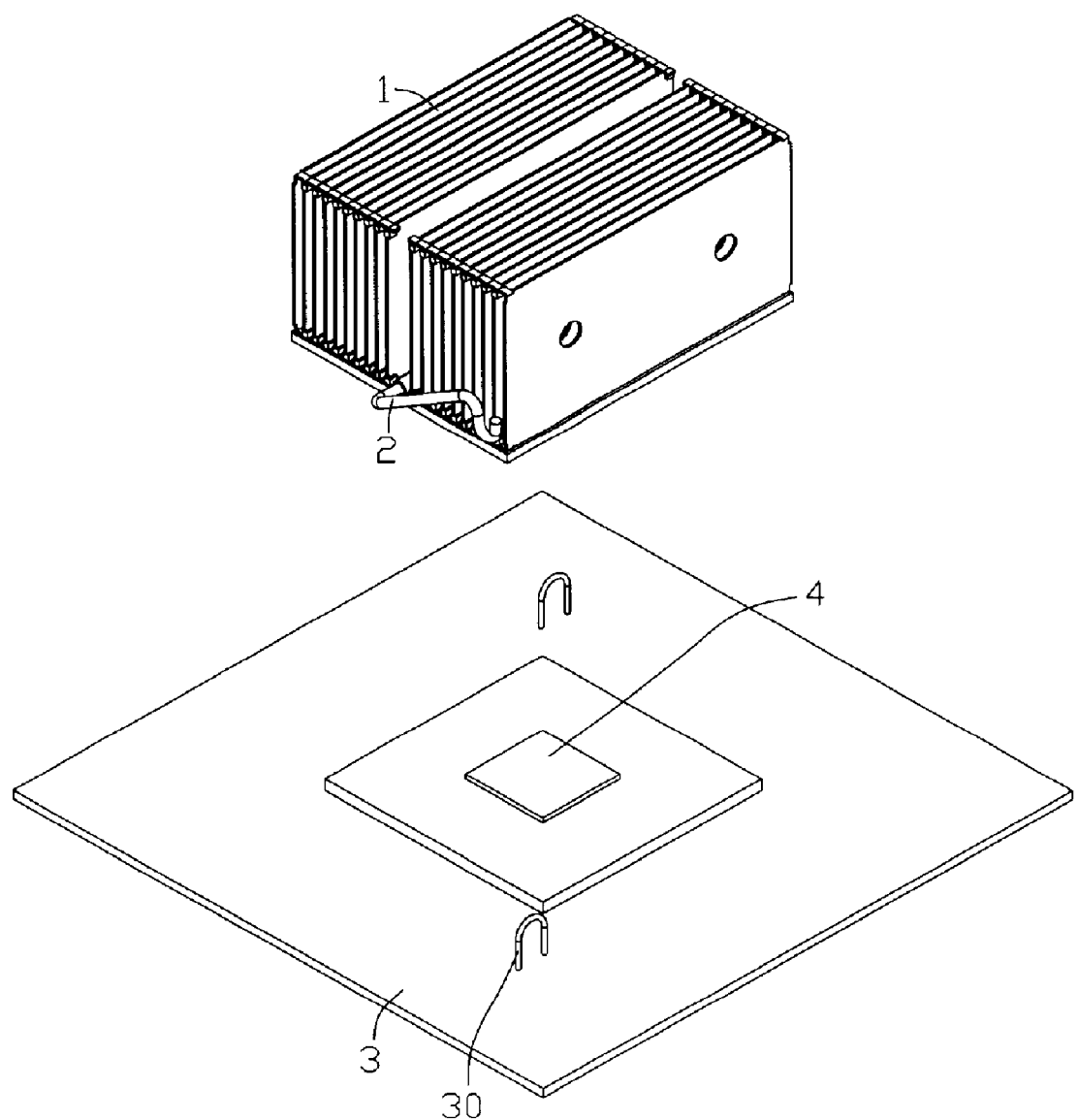
FIG. 6 is an exploded view of the heat sink assembly with the electronic assembly of FIG. 5.

FIGS. 5-6 show an electronic assembly comprising a printed circuit board (PCB) 3 and an electronic component such as a CPU 4 mounted on the PCB 3. A pair of locking handles 30 extend from the PCB 3 in the vicinity of diagonally opposite corners of the PCB 3. The base 10 of the heat sink 1 of the heat sink assembly is attached on the CPU 4. The legs 25 of the clip 2 are pressed downwardly to urge the hooked feet 250 to hook the locking handles 30. The pressing portions 232 of the clip 2 abut against the base 10 of the heat sink 1 to attach a top surface of the CPU 4. Thus, the base 10 of the heat sink 1 is firmly pressed against the CPU 4 by the pressing portions 232 of the clip 2. The heat sink 1 is securely fastened to the PCB 3 by the clip 2.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly for dissipating heat generated by an electronic component, the heat sink assembly comprising:
 a heat sink having a base and two arrays of fins extending from the base, a receiving groove being defined between the two arrays of fins, a first positioning portion extending from a first fin of one array of the fins at a side of the groove, the first positioning portion defining a first positioning slot therein;
 a clip positioned on the heat sink and securing the heat sink on the electronic component, the clip comprising;
 a main body comprising a retaining portion and a first pressing portion extending from an end of the retaining portion, the main body being received in the receiving groove of the heat sink and the retaining portion being offset away from the first pressing portion for preventing the main body from moving in a direction parallel to the receiving groove; and
 a pair of legs extending away from opposite ends of the main body; wherein the first pressing portion of the main body is accommodated in the first positioning slot and positioned between the first positioning portion and the base of the heat sink.

2. The heat sink assembly of claim 1, further comprising a second positioning portion extending from a second fin of the other array of fins at an opposite side of the groove and a second pressing portion extending from an opposite end of the retaining portion of the main body, the second pressing portion being positioned between the second positioning portion and the base of the heat sink.

3. The heat sink assembly of claim 2, wherein the second positioning portion defines a second positioning slot for accommodating the second pressing portion of the main body therein.

4. The heat sink assembly of claim 1, wherein the first positioning portion comprises a pair of first joining portions attached on the base.

5. The heat sink assembly of claim 4, wherein the first fin comprises a first flange extending from an edge thereof and attached on the base.

6. The heat sink assembly of claim 5, wherein each fin of each array of fins comprises four hooked portions at four corners thereof for engaging with each other.

7. The heat sink assembly of claim 1, wherein the first positioning portion is upwardly vaulted and thereby the first positioning slot is defined therein with a downward opening.

8. The heat sink assembly of claim 1, wherein a hooked foot extends from a distal end of each leg.

9. The heat sink assembly of claim 8, further comprising an electronic assembly with locking handles engaging with a respective hooked foot of the clip and wherein the main body of the clip presses the heat sink to attach on the electronic assembly.

10. An electronic device assembly comprising:
 an electronic assembly comprising a printed circuit board (PCB) and an electronic component mounted on the PCB, a pair of locking handles extending from the PCB;

a heat sink for dissipating heat generated by the electronic component, the heat sink having a base attached on the electronic component and fins extending from the base, a receiving groove being defined between the fins, a pair of positioning portions each extending from a respective one of two fins, the two fins being at opposite sides of the receiving groove toward the receiving groove;

a clip comprising:

a main body comprising a retaining portion and a pair of pressing portions extending from opposite ends of the retaining portion, the retaining portion being offset away from each pressing portion for preventing the main body from moving in a direction parallel to the receiving groove; and a pair of legs extending away from opposite ends of the main body, each leg having a hooked foot at a distal end thereof engaging in a corresponding locking handle of the PCB;

wherein the pressing portions of the main body are positioned between a respective one of the positioning portions and the base of the heat sink to abut against the base.

11. The electronic device assembly of claim 10, wherein the clip is made from a single piece of metallic wire.

12. The electronic device assembly of claim 10, wherein the clip is Z-shaped when viewed from above.

13. The electronic device assembly of claim 10, wherein each positioning portion defines a positioning slot for receiving a corresponding pressing portion of the main body of the clip.

14. The electronic device assembly of claim 13, wherein each positioning portion comprises a joining portion attached on a top surface of the base.

* * * * *